US006717254B2

(12) United States Patent
Siniaguine

(10) Patent No.: US 6,717,254 B2
(45) Date of Patent: Apr. 6, 2004

(54) DEVICES HAVING SUBSTRATES WITH OPENING PASSING THROUGH THE SUBSTRATES AND CONDUCTORS IN THE OPENINGS, AND METHODS OF MANUFACTURE

(75) Inventor: Oleg Siniaguine, San Carlos, CA (US)

(73) Assignee: Tru-Si Technologies, Inc., Sunnyvale, CA (US)

( * ) Notice: Subject to any disclaimer, the term of this patent is extended or adjusted under 35 U.S.C. 154(b) by 0 days.

(21) Appl. No.: 09/791,977

(22) Filed: Feb. 22, 2001

(65) Prior Publication Data

US 2002/0113321 A1 Aug. 22, 2002

(51) Int. Cl.[7] .......................... H01L 23/48; H01L 29/06
(52) U.S. Cl. ........................................ 257/690; 257/618
(58) Field of Search ................................. 257/690, 618

(56) References Cited

U.S. PATENT DOCUMENTS

| | | | |
|---|---|---|---|
| 3,739,463 A | 6/1973 | Aird et al. ...................... | 29/580 |
| 3,761,782 A | 9/1973 | Youmans ................. | 317/234 R |
| 3,810,129 A | 5/1974 | Behman et al. ........ | 340/173 DR |
| 3,811,117 A | 5/1974 | Anderson, Jr. et al. ..... | 298/918 |
| 3,881,884 A | 5/1975 | Cook et al. .................... | 29/590 |
| 3,991,296 A | 11/1976 | Kojima et al. ........... | 219/121 L |
| 3,993,917 A | 11/1976 | Kalter .................... | 307/235 F |
| 4,139,401 A | 2/1979 | McWilliams et al. ....... | 148/175 |
| 4,141,135 A | 2/1979 | Henry et al. .................. | 29/580 |
| 4,368,106 A | 1/1983 | Anthony ...................... | 204/15 |
| 4,394,712 A | 7/1983 | Anthony ..................... | 361/411 |
| 4,463,336 A | 7/1984 | Black et al. .................... | 338/4 |

(List continued on next page.)

FOREIGN PATENT DOCUMENTS

DE  19707887 A1  9/1998

| | | | |
|---|---|---|---|
| EP | 0238089 A2 | 9/1987 | .......... H01L/25/08 |
| EP | 807964 A1 | 4/1995 | |

(List continued on next page.)

OTHER PUBLICATIONS

Anthony, T., "Forming Feedthroughs in Laser–Drilled Holes in Semiconductor Wafers by Double–Sided Sputtering", *IEEE Trans. on Comp., Hybrids, & Mfg. Tech*, vol. CHMT–5, No. 1, Mar. 1982, pp. 171–180.

(List continued on next page.)

*Primary Examiner*—Amir Zarabian
*Assistant Examiner*—Kiesha Rose
(74) *Attorney, Agent, or Firm*—Michael Shenker; MacPherson Kwok Chen & Heid LLP

(57) ABSTRACT

In some embodiments, a fabrication method comprises: forming a structure that has one or more substrates, wherein the one or more substrates are either a single substrate or a plurality of substrates bonded together, wherein the structure comprises a non-electronically-functioning component which includes at least a portion of the one or more substrates and/or is attached to the one or more substrates; wherein the one or more substrates include a first substrate which has: a first side, an opening in the first side, and a conductor in the opening; wherein the method comprises removing material from the structure so that the conductor becomes exposed on a second side of the first substrate. In some embodiments, the second side is a backside of the first substrate, and the exposed conductor provides backside contact pads. In some embodiments, the fabrication method comprises: forming a structure comprising a first substrate which has: a first side, an opening in the first side, and a conductor in the opening; removing material from the structure so that the conductor becomes exposed on a second side of the first substrate; wherein removing of the material comprises removing the material from a first portion of the second side of the first substrate to cause the first portion to be recessed relative to a second portion of the second side of the first substrate.

58 Claims, 10 Drawing Sheets

U.S. PATENT DOCUMENTS

| | | | |
|---|---|---|---|
| 4,467,518 A | 8/1984 | Bansal et al. | 29/571 |
| 4,603,341 A | 7/1986 | Bertin et al. | 357/23.7 |
| 4,612,083 A | 9/1986 | Yasumoto et al. | 156/633 |
| 4,628,174 A | 12/1986 | Anthony | 219/76.13 |
| 4,722,130 A | 2/1988 | Kimura et al. | 29/413 |
| 4,733,290 A | 3/1988 | Reardon et al. | |
| 4,769,738 A | 9/1988 | Nakamura et al. | 361/283 |
| 4,807,021 A | 2/1989 | Okumura | 357/75 |
| 4,842,699 A | 6/1989 | Hua et al. | 204/15 |
| 4,870,745 A | 10/1989 | Lee | |
| 4,897,708 A | 1/1990 | Clement | 357/65 |
| 4,954,458 A | 9/1990 | Reid | 437/31 |
| 4,978,639 A | 12/1990 | Hua et al. | 437/230 |
| 4,996,587 A | 2/1991 | Hinrichsmeyer et al. | 357/74 |
| 5,064,771 A | 11/1991 | Solomon | 437/3 |
| 5,071,792 A | 12/1991 | VanVonno et al. | 437/227 |
| 5,160,987 A | 11/1992 | Pricer et al. | 257/307 |
| 5,166,097 A | 11/1992 | Tanielian | 437/203 |
| 5,191,405 A | 3/1993 | Tomita et al. | 257/777 |
| 5,225,771 A | 7/1993 | Leedy | 324/158 P |
| 5,229,647 A | 7/1993 | Gnadinger | 257/785 |
| 5,259,924 A | 11/1993 | Mathews et al. | 156/653 |
| 5,268,326 A | 12/1993 | Lesk et al. | 437/62 |
| 5,307,942 A | 5/1994 | Quelfeter et al. | 211/26 |
| 5,309,318 A | 5/1994 | Beilstein, Jr. et al. | 361/689 |
| 5,313,097 A | 5/1994 | Haj-Ali-Ahmadi et al. | 257/706 |
| 5,314,844 A | 5/1994 | Imamura | 437/226 |
| 5,322,816 A | 6/1994 | Pinter | 437/203 |
| 5,323,035 A | 6/1994 | Leedy | 257/248 |
| 5,340,771 A | 8/1994 | Rostoker | 437/209 |
| 5,380,681 A | 1/1995 | Hsu | 437/209 |
| 5,399,898 A | 3/1995 | Rostoker | 257/499 |
| 5,414,637 A | 5/1995 | Bertin et al. | 364/489 |
| 5,426,566 A | 6/1995 | Beilstein, Jr. et al. | 361/735 |
| 5,453,404 A * | 9/1995 | Leedy | 216/11 |
| 5,463,246 A | 10/1995 | Matsunami | 257/621 |
| 5,466,634 A | 11/1995 | Beilstein, Jr. et al. | 437/180 |
| 5,467,305 A | 11/1995 | Bertin et al. | 365/185.01 |
| 5,468,663 A | 11/1995 | Bertin et al. | 437/43 |
| 5,472,914 A | 12/1995 | Martin et al. | 437/209 |
| 5,478,781 A | 12/1995 | Bertin et al. | 437/209 |
| 5,489,554 A | 2/1996 | Gates | 437/208 |
| 5,494,832 A | 2/1996 | Lehmann et al. | 437/2 |
| 5,502,333 A | 3/1996 | Bertin et al. | 257/685 |
| 5,502,667 A | 3/1996 | Bertin et al. | 365/51 |
| 5,504,036 A | 4/1996 | Dekker et al. | 437/183 |
| 5,506,753 A | 4/1996 | Bertin et al. | 361/705 |
| 5,517,057 A | 5/1996 | Beilstein, Jr. et al. | 257/686 |
| 5,517,754 A | 5/1996 | Beilstein, Jr. et al. | 29/840 |
| 5,532,519 A | 7/1996 | Bertin et al. | 257/777 |
| 5,550,942 A | 8/1996 | Sheem | 385/53 |
| 5,561,622 A | 10/1996 | Bertin et al. | 365/51 |
| 5,563,086 A | 10/1996 | Bertin et al. | 437/52 |
| 5,567,653 A | 10/1996 | Bertin et al. | 437/173 |
| 5,567,654 A | 10/1996 | Beilstein, Jr. et al. | 437/209 |
| 5,571,754 A | 11/1996 | Bertin et al. | 437/209 |
| 5,596,226 A | 1/1997 | Beilstein, Jr. et al. | 257/690 |
| 5,627,106 A | 5/1997 | Hsu | 438/459 |
| 5,646,067 A | 7/1997 | Gaul | 437/180 |
| 5,654,127 A | 8/1997 | Leedy | 430/315 |
| 5,656,553 A | 8/1997 | Leas et al. | 438/15 |
| 5,707,485 A | 1/1998 | Rolfson et al. | 156/643.1 |
| 5,843,844 A | 12/1998 | Miyanaga | 483/694 |
| 5,846,879 A | 12/1998 | Winnerl et al. | 430/666 |
| 5,851,845 A | 12/1998 | Wood et al. | 438/15 |
| 5,888,882 A | 3/1999 | Igel et al. | 438/460 |
| 5,888,883 A | 3/1999 | Sasaki et al. | 438/460 |
| 5,904,496 A | 5/1999 | Richards et al. | |
| 5,979,475 A | 11/1999 | Satoh et al. | 134/140 |
| 5,998,292 A | 12/1999 | Black et al. | 438/618 |
| 6,004,867 A | 12/1999 | Kim et al. | 438/459 |
| 6,075,239 A | 6/2000 | Aksyuk et al. | 250/229 |
| 6,083,811 A | 7/2000 | Riding et al. | 438/460 |
| 6,094,244 A * | 7/2000 | Kawata et al. | 349/74 |
| 6,121,119 A | 9/2000 | Richards et al. | 438/462 |
| 6,126,846 A * | 10/2000 | Silverbrook | 216/27 |
| 6,162,701 A | 12/2000 | Usami et al. | 438/455 |
| 6,176,966 B1 | 1/2001 | Tsujimoto et al. | 156/344 |
| 6,184,060 B1 | 2/2001 | Siniaguine | 438/106 |
| 6,322,903 B1 * | 11/2001 | Siniaguine et al. | 428/617 |

FOREIGN PATENT DOCUMENTS

| | | | |
|---|---|---|---|
| EP | 0 698 288 | 2/1996 | |
| EP | 757431 A2 | 7/1996 | |
| WO | WO 92/03848 | 3/1992 | |
| WO | WO 94/09513 | 4/1994 | |
| WO | WO 94/25981 | 11/1994 | |
| WO | WO 96/21943 | 7/1996 | |
| WO | WO 97/45856 | 12/1997 | |
| WO | WO 97/45862 | 12/1997 | |
| WO | WO 98/18337 | 5/1998 | |
| WO | WO 98/19337 | 5/1998 | H01L/21/44 |

OTHER PUBLICATIONS

AZ Corporation, "Plasma Jet Etching Technology and Equipment; Silicon Wafer Thinning & Isotropical Etching at Atmospheric Pressure", Semicon/Europe, Apr. 1995, Geneva, Switzerland, 4 pages.

Christensen, C., et al., "Wafer Through–Hole Interconnections with High Vertical Wiring Densities", *IEEE Trans. on Comp., Pkg, & Mfg. Tech*, Part A, vol. 19, No. 4, Dec. 1996, pp. 516–521.

IPEC Precision brochure for PACEJET II (©1996), 2 pages.

Siniaguine, Oleg, "Plasma Jet Etching at Atmospheric Pressure for Semiconductor Production", First Int'l. Symposium on Plasma Process–Induced Damage, May 13–14, 1996, Santa Clara, pp. 151–153.

* cited by examiner

DEVICES HAVING SUBSTRATES WITH OPENING PASSING THROUGH THE SUBSTRATES AND CONDUCTORS IN THE OPENINGS, AND METHODS OF MANUFACTURE

BACKGROUND OF THE INVENTION

The present invention relates to devices having substrates with openings passing through the substrates and conductors in the openings. Some devices of the invention incorporate non-electronically-functioning components. Examples include micro-electro-mechanical systems (MEMS) and other micro-structure-technology (MST) structures.

Integrated circuit fabrication technology has been used to create micro-electro-mechanical and micro-electro-optical structures. Examples of such structures include relays, micropumps, and optical devices for fingerprint recognition. FIG. 1 illustrates one such structure 120 formed on a semiconductor die ("chip") 130. The die contains electronic circuitry (not shown) and interconnect lines (not shown) which couple the structure 120 to contact pads 140. The die has been fabricated in a batch process with other such dies on a semiconductor wafer. After the die was separated from the wafer by dicing, bond wires 150 were bonded to the contact pads 140 and lead frame pins 160. Then the lead frame was encapsulated into a ceramic substrate 170, with pins 160 protruding from the substrate. Another substrate 180 was bonded to substrate 170 to protect the die and the structure 120. If the structure 120 is an optical device (e.g. a mirror or an optical sensor), the substrate 180 is made of a suitable transparent material, e.g. glass.

Improved fabrication techniques and structures suitable for such devices are desirable. It is also desirable to increase the mechanical strength of devices with or without non-electrically functioning components.

SUMMARY

Some embodiments of the present invention combine techniques for fabricating micro-electro-mechanical and micro-electro-optical structures with backside contact fabrication technology used for vertical integration and described in PCT publication WO 98/19337 (TruSi Technologies, LLC, May 7, 1998).

The invention is not limited to such embodiments. In some embodiments, a fabrication method comprises:
  forming a structure that has one or more substrates, wherein the one or more substrates are either a single substrate or a plurality of substrates bonded together, wherein the structure comprises a non-electronically-functioning component which includes at least a portion of the one or more substrates and/or is attached to the one or more substrates;
  wherein the one or more substrates include a first substrate which has: a first side, an opening in the first side, and a conductor in the opening;
  wherein the method comprises removing material from the structure so that the conductor becomes exposed on a second side of the first substrate.

In some embodiments, the second side is a backside of the first substrate, and the exposed conductor provides backside contact pads. The front side of the first substrate can be bonded to another substrate or substrates which protect the non-electronically-functioning component during processing, including the processing that exposes the conductor. The component is also protected during dicing. The other substrate or substrates can be transparent as needed in the case of an optical component. The other substrate or substrates can be closely positioned to the component to reduce optical distortion. Also, small system area can be achieved.

In some embodiments, the fabrication method comprises:
  forming a structure comprising a first substrate which has: a first side, an opening in the first side, and a conductor in the opening;
  removing material from the structure so that the conductor becomes exposed on a second side of the first substrate;
  wherein removing of the material comprises removing the material from a first portion of the second side of the first substrate to cause the first portion to be recessed relative to a second portion of the second side of the first substrate.

The resulting structure may or may not have a non-electronically-functioning component. In some embodiments, the first substrate is thicker at the second portion than at the first portion. The thicker second portion improves the mechanical strength of the structure.

Other features and advantages of the invention are described below.

DESCRIPTION OF PREFERRED EMBODIMENTS

Figure 2A:
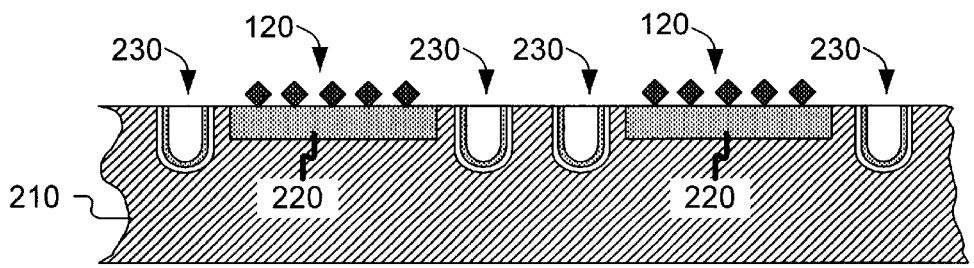
FIGS. 2A, 2B, and 3–16 are vertical cross-sectional views of devices with non-electronically-functioning components at different stages of fabrication according to the present invention.

FIG. 2A illustrates miniature structures 120 fabricated in and/or on a wafer 210. Structures 120 include optical, mechanical, magnetic, and/or other kinds of non-electronically-functioning components. Non-electronically-functioning components may or may not have electronic circuitry (e.g. transistors), but their operation includes functionality not present in traditional electronic circuitry. For example, a non-electronically-functioning component may have to move or deform during operation. Examples of such components are diaphragms of micropumps and moving parts of micro-mechanical switches. The component may emit and/or sense visible or invisible light (electromagnetic radiation). See J. E. Gulliksen, "MST vs. MEMS: WHERE ARE WE?", *Semiconductor Magazine*, Oct. 2000, Vol. 1, No. 10. The component may be a mirror or a lens. Such components may be present in devices for fingerprint recognition, optical disc readers, bar code readers, or other MEMS and MST structures. A component may interact with an external magnetic field. The invention is not limited to any particular kind of components. The invention provides techniques that may be used with components not yet invented.

The non-electronically-functioning components of structures 120 may include parts of substrate 210. The components may also include released components, i.e. components originally manufactured on another substrate (not shown) and then released from that substrate. See e.g. U.S. Pat. No. 6,076,256 (released mirrors).

Structures 120 can be coupled to circuitry 220 fabricated in and/or on substrate 210. Circuitry 220 may be used in operation of the non-electronically-functioning components. The circuitry may control the components or receive signals indicative of the state of the components. Circuitry 220 may include amplifiers, filters, or any other electronic circuitry. Substrate 210 can be made from a suitable semiconductor material, for example, silicon. In some embodiments, circuitry 220 contains only interconnect lines. In some of these embodiments, substrate 210 is made from a non-semiconductor material, for example, a dielectric polymer or glass.

Circuitry 220 and/or structures 120 are connected to contact structures 230. One structure 230 is shown on a larger scale in FIG. 2B. Structures 230 can be fabricated as described, for example, in PCT publication WO 98/19337 (TruSi Technologies, LLC, May 7, 1998); U.S. application Ser. No. 09/083,927, filed May 22, 1998 (now U.S. Pat. No. 6,184,060); and U.S. application Ser. No. 09/456,225, filed Dec. 6, 1999 (now U.S. Pat. No. 6,322,903); all of which are incorporated herein by reference. Briefly, vias 260 are etched in substrate 210. Insulator 270 is formed in the vias. Conductor 280 (for example, metal) is formed over the insulator 270. Optionally, another material 290 is formed over the conductor 280 to fill the vias.

Insulator 270 can be omitted if wafer 210 is made from an insulating material. Also, the vias can be filled with conductor 280.

Structures 120, circuitry 220, and contact structures 230 can be fabricated in any order. For example, circuitry 220 can be made first, contact structures 230 can be made next, and the structures 120 can be made last. Alternatively, the steps forming the elements 230, 220, 120 can be interleaved, and the same steps can be used to form more than one of these elements.

Figure 3:
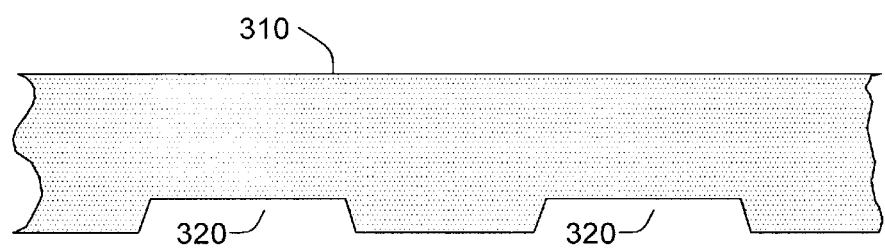

FIG. 3 shows a wafer 310 which will be bonded to wafer 210. Cavities 320 have been formed in the wafer. Alignment marks (not shown) can be formed on substrate 310 on the same or opposite side as cavities 320. In one embodiment, wafer 310 is glass polished on top and bottom. In some embodiments, wafers 310 and 210 are made of the same material (for example, silicon) to match their thermal expansion coefficients.

Cavities 320 and the alignment marks can be formed by conventional processes. See for example, U.S. Pat. No. 6,097,140 (glass etch).

Figure 4:
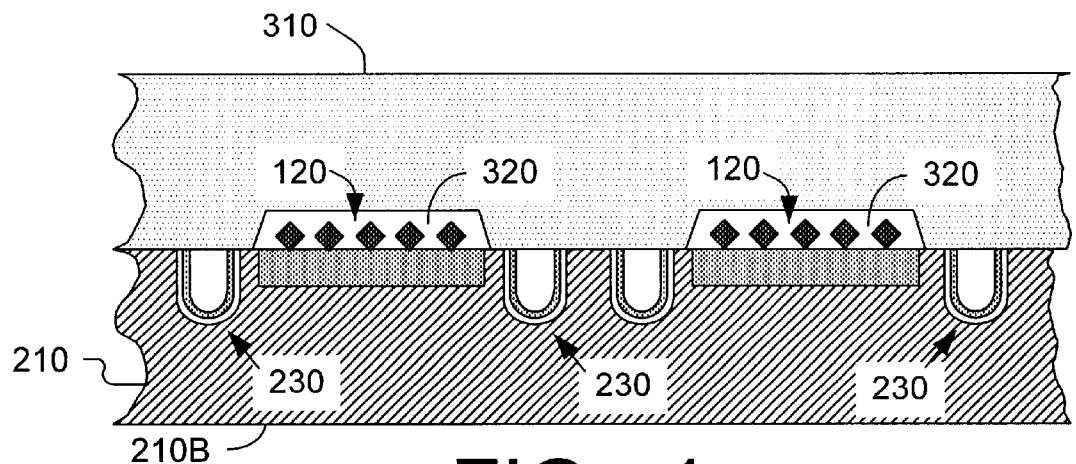
Figure 5:
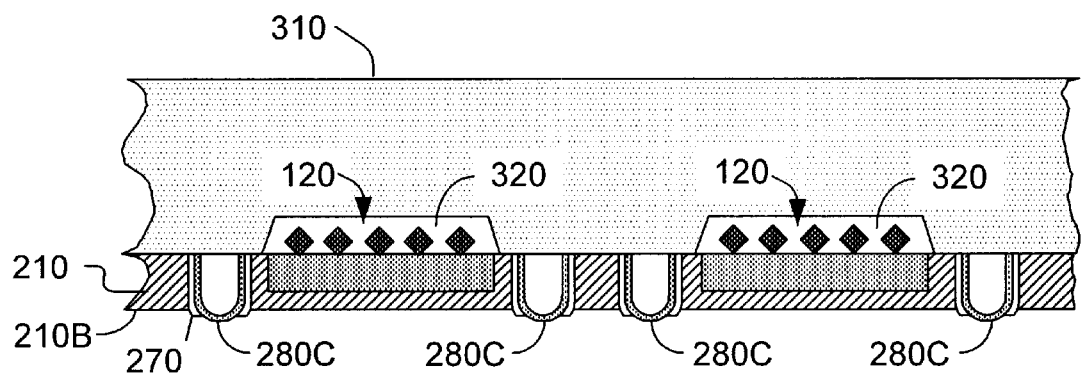

Wafers 310, 210 are bonded together (FIG. 4). Structures 120 become positioned in cavities 320. The wafers can be bonded by conventional techniques, for example, with an adhesive or a glass frit in vacuum. Before the adhesive is deposited, and even before the structures 120 are attached to wafer 210, portions of wafer 210 can be covered with an insulating material to insulate the wafer from the adhesive.

The wafers can also be bonded by solder bonding, eutectic bonding, thermocompression, with epoxy, and by other techniques, known or to be invented.

Figure 6:
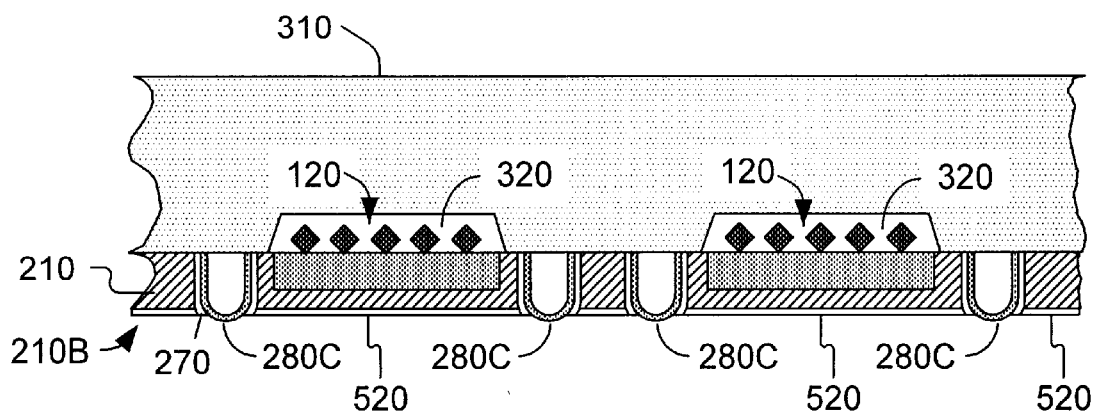

Then the backside 210B of wafer 210 (the side opposite to the side bonded to wafer 310) is processed to expose the contacts 280C formed by the conductor 280 at the bottom of vias 260. This processing can be performed by methods described in U.S. patent application Ser. No. 09/456,225 (now U.S. Pat. No. 6,322,903) and PCT application WO 98/19337. According to one such method, substrate 210 and insulator 270 are etched by an atmospheric pressure plasma etch to expose the contacts 280C. Then an insulator 520 (FIG. 6) is grown selectively on silicon 210 but not on conductor 280.

Figure 7:
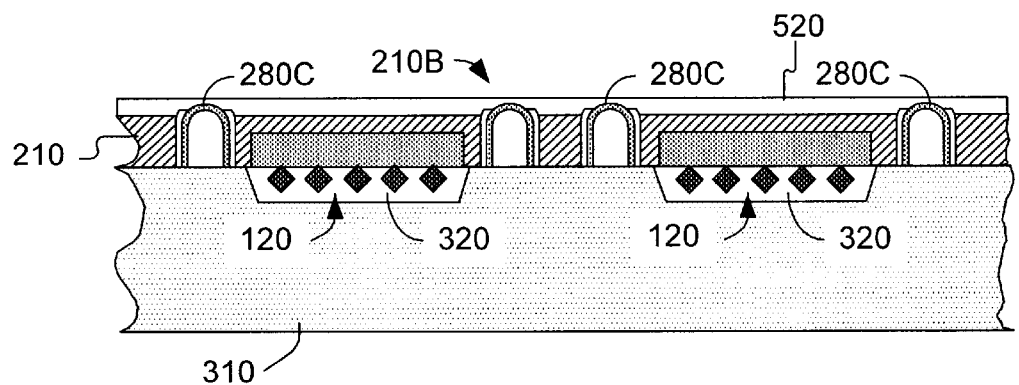

According to another method, after the conductor 280 has been exposed by the etch of substrate 210 and insulator 270, the structure is turned upside down (FIG. 7), and insulator 520 is deposited by a spin-on or spraying process and then cured. Insulator 520 can be polyimide, glass, or some other flowable material (for example, a flowable thermosetting polymer.) The top surface of layer 520 is substantially planar, or at any rate the layer 520 is thinner over contact structures 230 than elsewhere. In some embodiments, layer 520 does not cover the contacts 280C. If needed, layer 520 can be etched with a blanket etch to adequately expose the contacts 280C (e.g., if insulator 520 covered the contacts). The etch does not expose the substrate 210. The resulting wafer structure is like that of FIG. 6.

Figure 8:
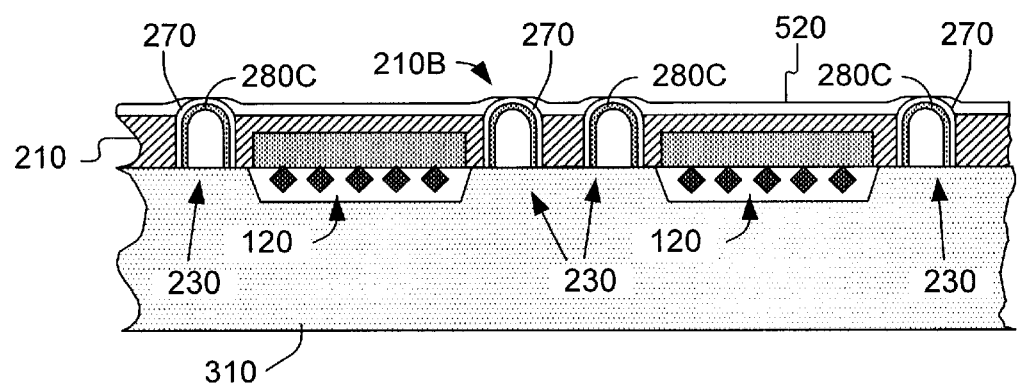
Figure 9:
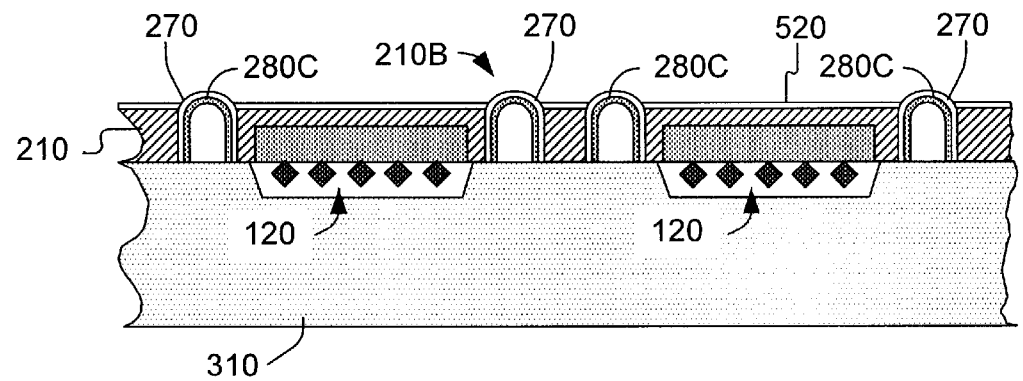

According to another method, the etch of substrate 210 exposes the insulator 270 but not the conductor 280. See FIG. 8. Insulator 270 protrudes from the substrate surface. The wafer structure is turned upside down (FIG. 8), and insulating layer 520 is formed as described above in connection with FIG. 7. Layer 520 is thinner over the contact structures 230 than elsewhere. In some embodiments, layer 520 does not cover the contact structures. If needed, layer 520 can be etched with a blanket etch to adequately expose the insulator 270 (FIG. 9). Then insulator 270 is etched selectively to insulator 520 to expose the conductor 280. In some embodiments, insulator 270 is silicon dioxide and insulator 520 is polyimide. The resulting wafer structure is like that of FIG. 6.

One advantage of the processes of FIGS. 5–9 is that no photolithography is required. Other techniques, including techniques involving photolithography, can also be used.

Figure 10:
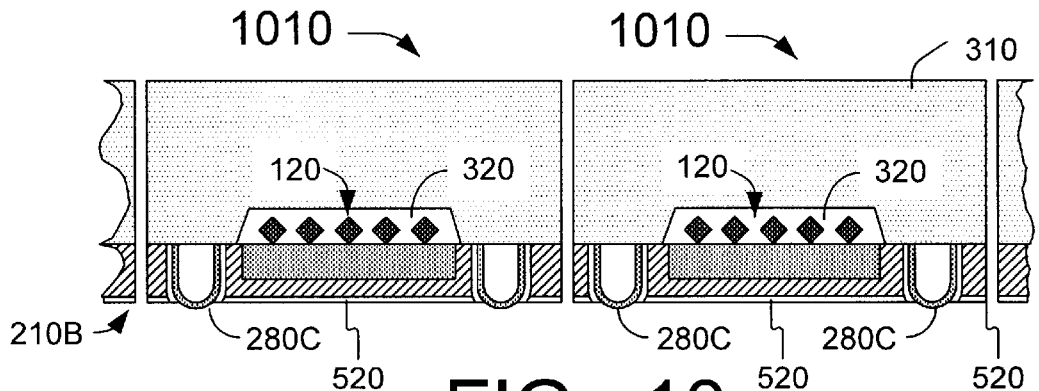

The wafer structure is diced into individual chips 1010 (FIG. 10). The structures 120 are protected by the substrates 210, 310 during dicing.

Chips 1010 can be attached to a wiring substrate (not shown), for example, a printed circuit board (PCB). Contacts 280C can be directly attached to the wiring substrate using flip chip technology. See the aforementioned U.S. patent application Ser. No. 09/456,225. Alternatively, chips 1010 can be turned upside down, with the contacts 280C facing up, and the chips can be wire bonded to a lead frame and packaged using conventional technology. Ball grid arrays, chip scale packages, and other packaging technologies, known or to be invented, can be used.

Figure 1:
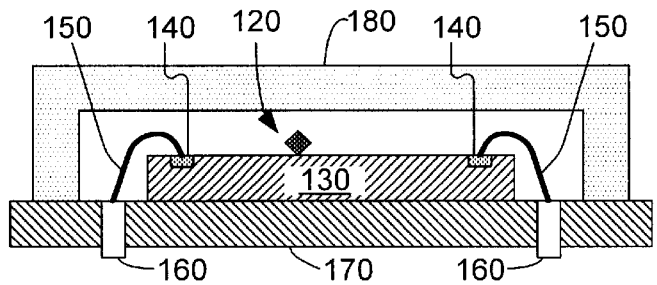
FIG. 1 is a vertical cross-sectional view of a prior art device having a micro-electro-mechanical or micro-electro-optical structure.

Advantageously, after wafers 210, 310 have been bonded together, the structures 120 and circuitry 220 are protected by the two wafers. The area is small because the substrate 310 does not extend around the substrate 210 as in FIG. 1. Cavities 320 can be made shallow so that the substrate 310 can be positioned close to structures 120. This is advantageous for optical applications because optical distortion is reduced. Further, since substrate 310 is placed directly on substrate 210, precise positioning of substrate 310 relative to structures 120 is facilitated.

For optical applications, substrate 310 can be covered by non-reflective coatings. Cavities 320 can be filled with refractive index matching materials. Lenses can be etched in substrate 310.

Substrate 310 may contain electronic circuitry coupled to structures 120 and/or circuitry 220. Substrate 310 can be fabricated from insulating or semiconductor materials. U.S. patent application Ser. No. 09/456,225 describes some techniques that can be used to connect circuitry in substrate 310 to circuitry 220.

Figure 11:
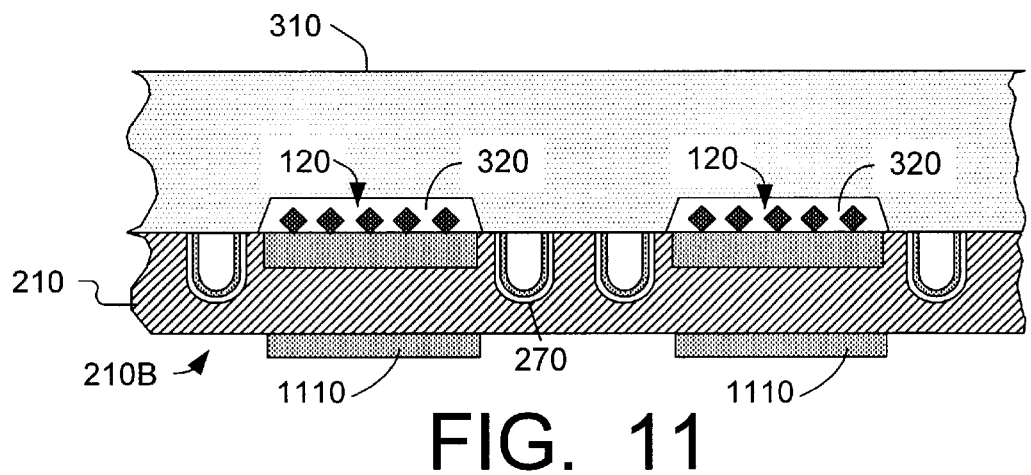

FIG. 11 illustrates an embodiment in which the backside contacts are redistributed along the backside 210B of wafer 210 to obtain an area matched package. After the stage of FIG. 4, mask 1110 is formed on the backside 210B of substrate 210 and photolithographically patterned. Optionally, before the mask is formed, substrate 210 can be thinned from backside 210B, but the insulator 270 does not have to be exposed. The thinning can be performed by mechanical grinding, plasma etching, or other methods, known or to be invented.

Figure 12:
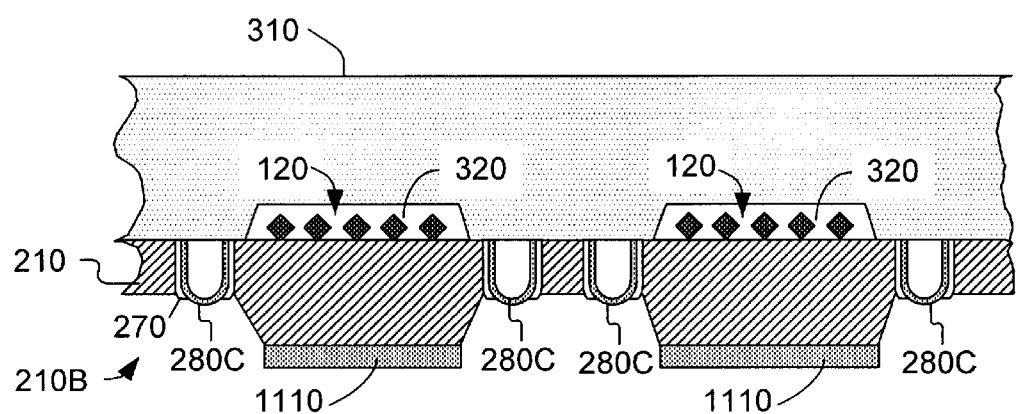
Figure 13:
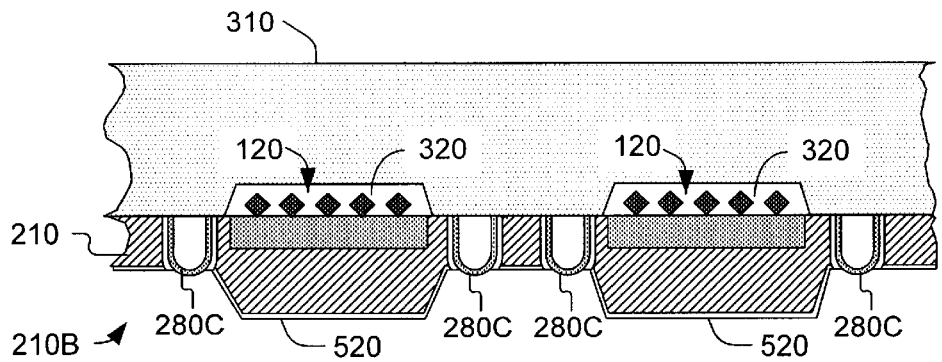

Substrate 210 and insulator 270 are etched selectively to mask 1110 to expose contact portions 280C of conductor 280 on backside 210B (FIG. 12). Suitable etching processes are described above in connection with FIG. 5. Then mask 1110 is stripped, and insulating layer 520 (FIG. 13) is formed selectively on backside 210B of substrate 210 but not on conductor 280. See the description above in connection with FIG. 6.

Figure 14:
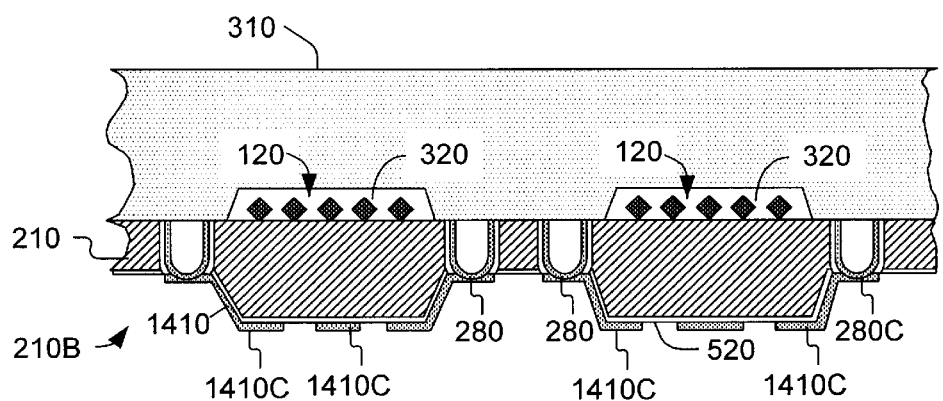
Figure 15:
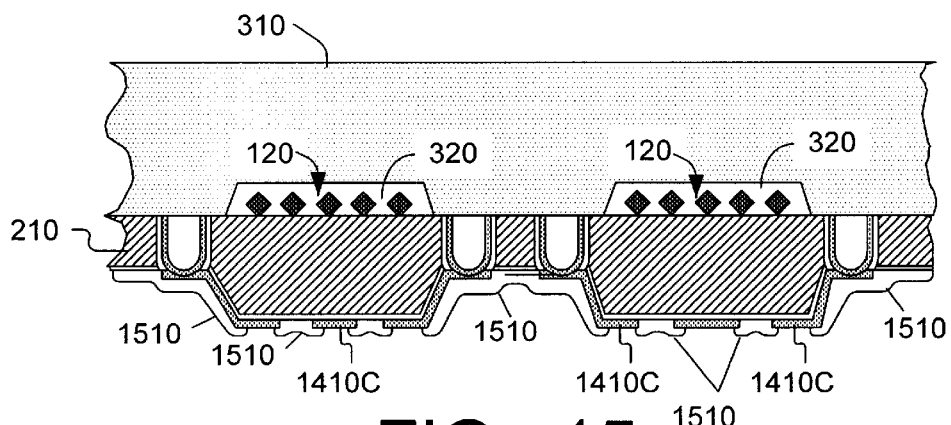

Conductive layer 1410 (FIG. 14), for example, a metal suitable for integrated circuit bond pads, is deposited and patterned on the wafer backside to provide conductive pads 1410C and conductive lines connecting these pads to conductor 280. Then a suitable insulator 1510 (FIG. 15) is deposited and patterned to expose the conductive pads 1410C.

Figure 16:
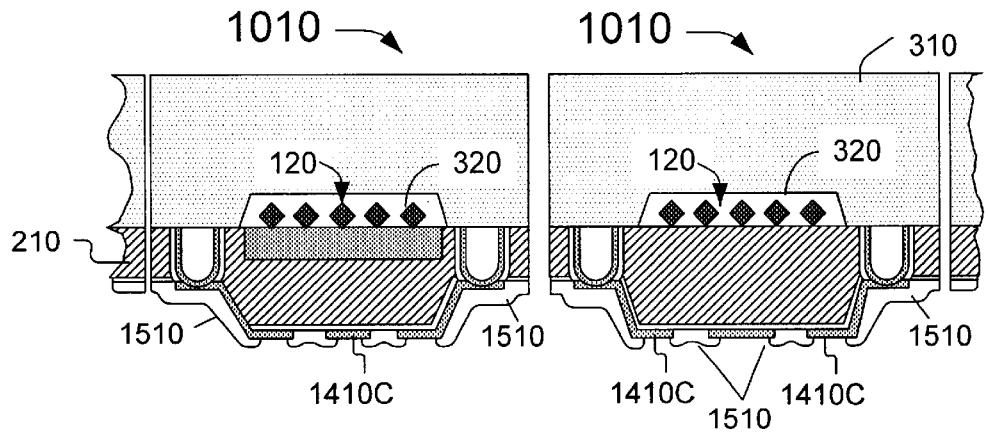
Figure 17:
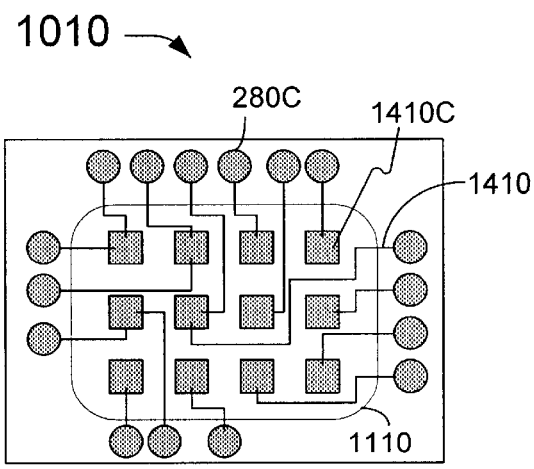
FIGS. 17 and 18 are bottom views of devices having non-electronically-functioning components according to the present invention.

Then the wafer structure is diced (FIG. 16). Pads 1410C of the resulting chips 1010 can be attached directly to a wiring substrate, for example, a PCB. The bottom view of a single chip 1010 is shown in FIG. 17. FIG. 17 also shows an outline of mask 1110 of FIG. 11.

One advantage of the embodiment of FIGS. 11–17 is as follows. The position of contact structures 230 is limited by the layout of circuitry 220 and structures 120. For example, the contact structures 230 may have to be restricted to the periphery of chips 1010. Since contacts 280C are not directly attached to a wiring substrate, their size can be reduced. The size of contact pads 1410C is sufficiently large to allow direct attachment to a wiring substrate, but the position of contact pads 1410C is not restricted by circuitry 220 and structures 120. The chip area can therefore be smaller.

Figure 18:
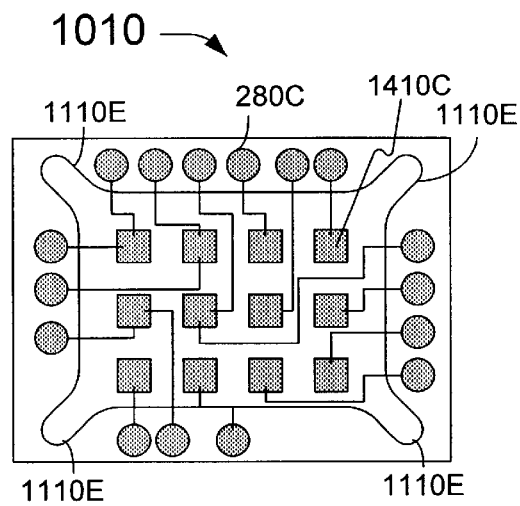

In FIG. 18, the mask 1110 has four extensions 1110E extending to the boundary (e.g. corners) of chip 1010. These extensions increase the mechanical strength of the chip. The extensions may come as close, or closer, to the chip boundary as the contacts 280C. In some embodiments, the extensions reach the chip boundary and merge with the extensions on the adjacent chips. The extensions may extend between the contacts. More or fewer than four extensions can be provided.

The extensions can be formed in structures that do not have non-electronically-functioning components.

Figure 19:
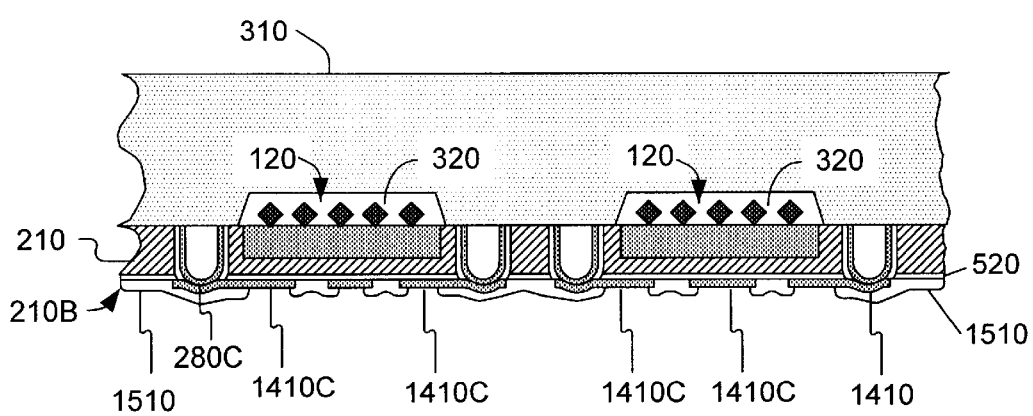
FIGS. 19–25 are vertical cross-sectional views of devices having non-electronically-functioning components at different stages of fabrication according to the present invention.

In another embodiment, the wafer structure is processed to the stage of FIG. 6 by any of the methods described above in connection with FIGS. 5–9. Then conductive layer 1410 (FIG. 19) is deposited and patterned on backside 210B over insulator 520 to form contact pads 1410C and conductive lines connecting the contact pads to conductor 280, as described above in connection with FIG. 14. Mask 1110 is not used. Then insulator 1510 is deposited and patterned to expose the contact pads 1410C, as described above in connection with FIG. 15.

Figure 20:
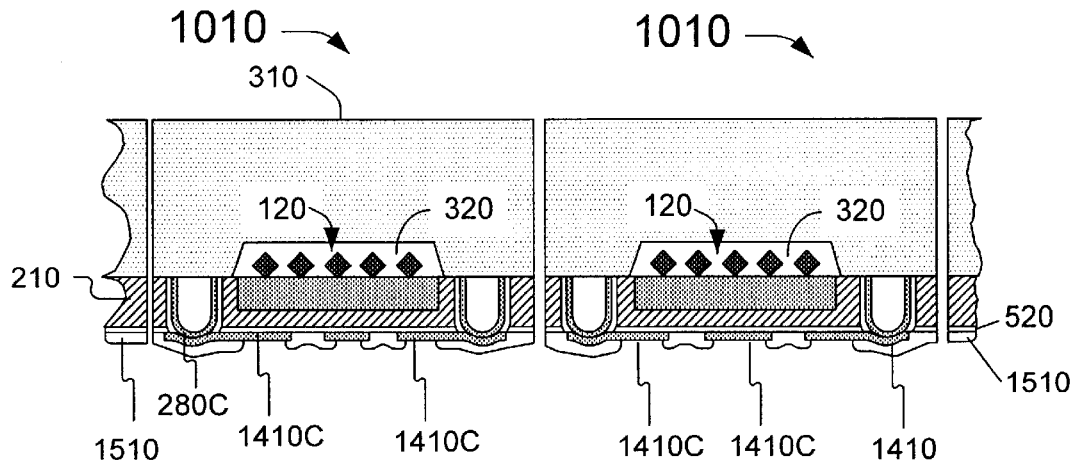

The wafer structure is tested and diced to form individual chips 1010 (FIG. 20).

Figure 21:
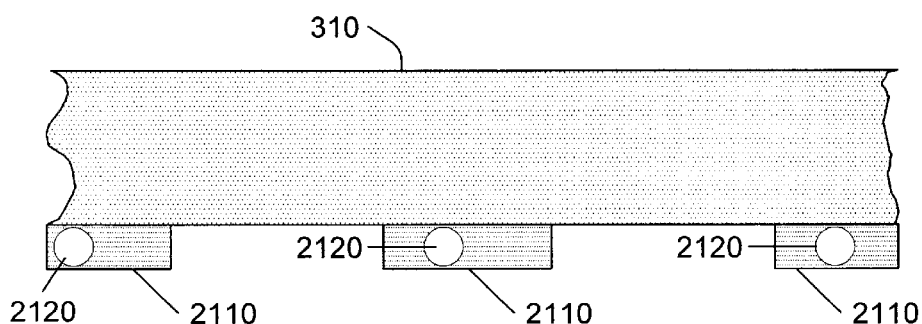

FIG. 21 illustrates alternative processing of wafer 310. No cavities are etched in the wafer. Stand-off features 2110 are formed on the wafer surface. Features 2110 can be formed by depositing an appropriate material and patterning the material photolithographically, or by silk-screen printing, or by dispensing the material using a needle, or by other techniques, known or to be invented. Suitable materials include epoxy, thermosetting polymers, glass frit.

Figure 22:
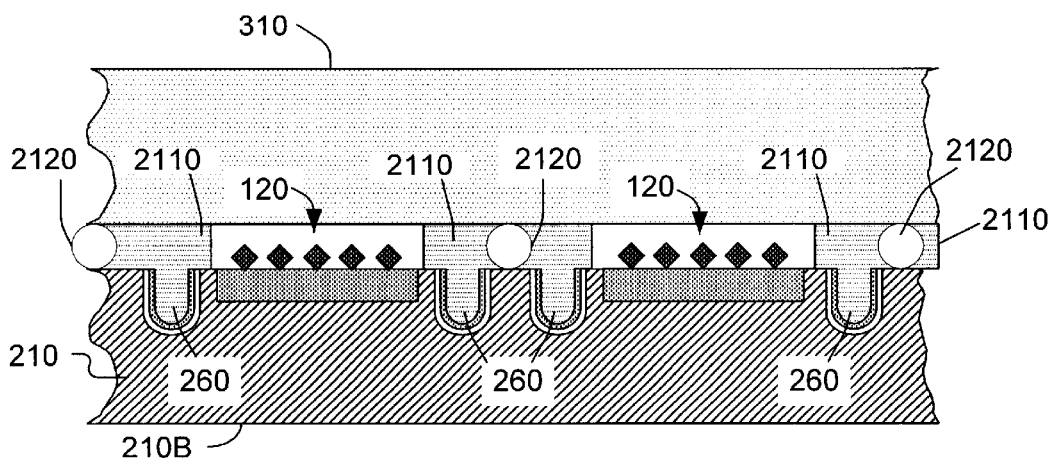

Wafer 210 is processed as in FIG. 3. Then wafers 310, 210 are aligned and bonded as shown in FIG. 22. Stand-off features 2110 are bonded to wafer 210. Structures 120 are located between the stand-off features. Then the wafer structure is processed by any of the methods described above in connection with FIGS. 5–20.

Figure 2B:
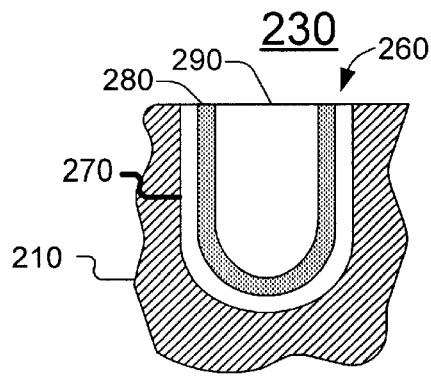

In the embodiment of FIG. 22, material 2110 is used to fill the vias 260. Material 290 that fills the vias in FIG. 2B is absent in FIG. 22, or is used to fill the vias only partially. Material 2110 is not fully hardened when the wafers are bonded. Material 2110 fills the vias 260 during the bonding process. The bonding is performed in vacuum to make it easier for the material 2110 to fill the vias 260.

In some embodiments in which the bonding process starts before the material 2110 is hardened, spacers are formed on wafer 310 or 210, or both, to maintain a minimum distance between the two wafers to prevent the wafer 210 from damaging the structures 120. The spacers can be fixed hard features formed on the wafers. Alternatively, the spacers can be hard balls 2120 floating in material 2110. The balls can be made of glass, resin, or some other suitable material (possibly a dielectric). Balls 2120 maintain the minimum distance between the wafers 310, 210 when the wafers are bonded together. An exemplary diameter of balls 2120 is 10–30 $\mu$m. The diameter is determined by the distance to be maintained between the two wafers. See U.S. Pat. No. 6,094,244, issued Jul. 25, 2000.

In some embodiments, the stand-off features 2110 completely surround the structures 120 and maintain the vacuum in the regions in which the structures 120 are located. The vacuum helps to hermetically isolate the structures 120 when the ambient pressure increases to atmospheric pressure. The strength of the bond between the two wafers is also improved.

In some embodiments, the material 2110 is deposited on wafer 210 rather than wafer 310.

In some embodiments, the material 2110 covers and contacts the structures 120.

In some embodiments, the material 2110 is hardened before the wafers are bonded, and is not used to fill the vias 260.

Figure 23:
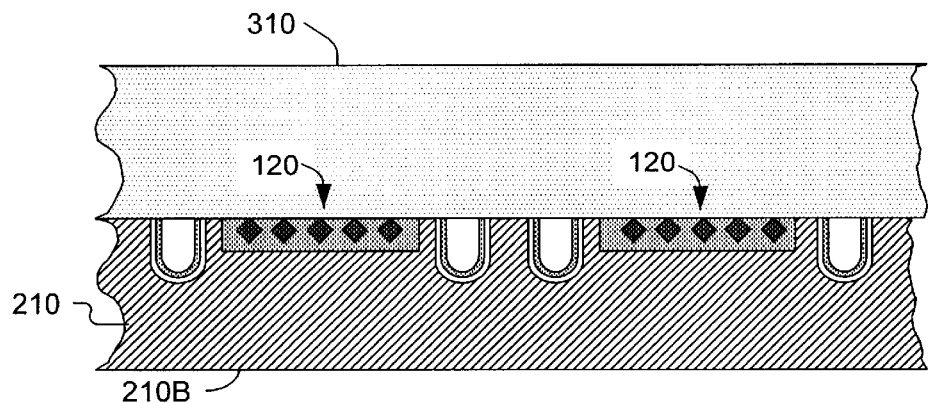

In FIG. 23, structures 120 do not protrude from the top surface of substrate 210. No cavities or stand-off features are made on wafer 310. This provides close positioning between the substrate 310 and structures 120. This is particularly advantageous if the structures 120 have optical components.

Figure 24:
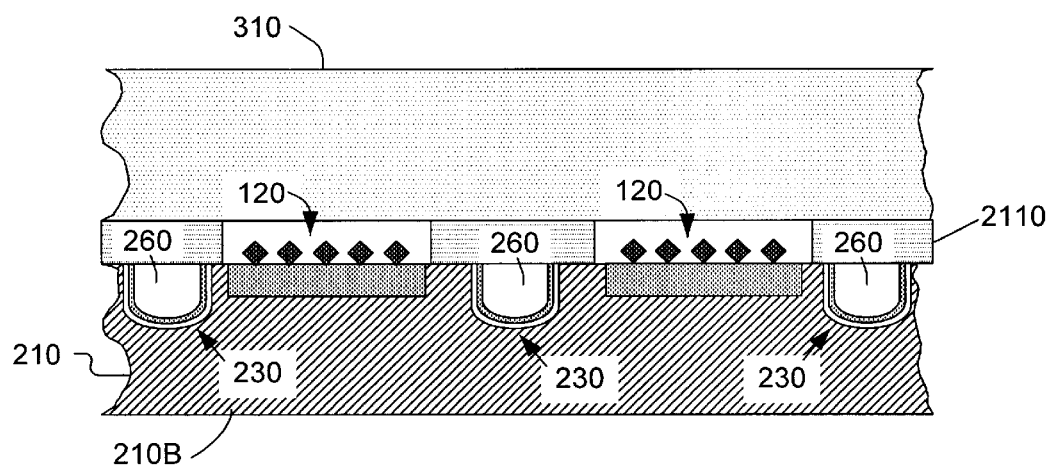
Figure 25:
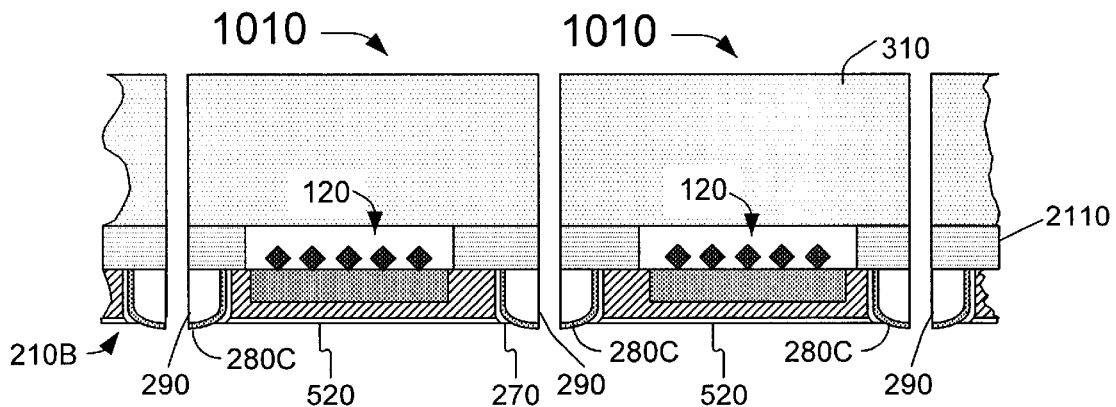
Figure 26:
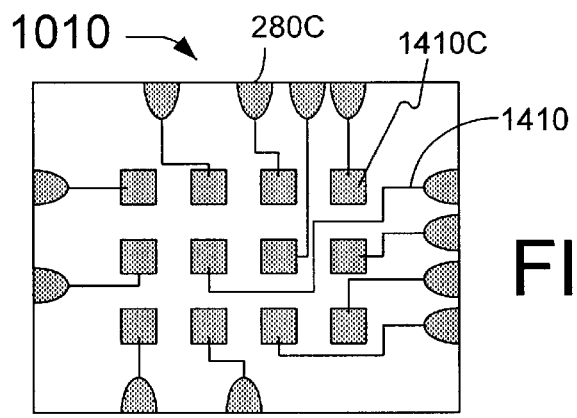
FIG. 26 is a bottom view of a device with non-electronically-functioning components according to the present invention.

In FIGS. 24–26, at least some of the contact structures 230 are positioned on the chip boundaries (on the dicing lines). In other respects, fabrication can proceed according to any method described above in connection with FIGS. 5–23. FIG. 24 illustrates the wafer structure processed as in FIG. 4. FIG. 25 illustrates the structure after dicing. FIG. 26 is a bottom view of a resulting chip 1010. One advantage of placing the contact structures 230 on the chip boundaries is reduced area. Also, the contact structures 230 can be contacted on a side of the chip, especially if the material 290 is conductive or is omitted. If the wafer structure is processed as in FIG. 16 or 20, contacts 1410C are available on the backside while contact structures 230 can be contacted on the sides. In some embodiments, the large width of vias 260 in which the contact structures are formed allows the vias to be etched by an isotropic etching process. Isotropic etching can be less expensive than anisotropic etching.

In some embodiments, the vias 260 are filled with material 2110, as in FIG. 22.

In FIGS. 24–26, the wafer 310 is as in FIG. 21. In other embodiments with contact structures 230 on the chip boundaries, wafer 310 is as in FIG. 3 or 23.

Figure 27:
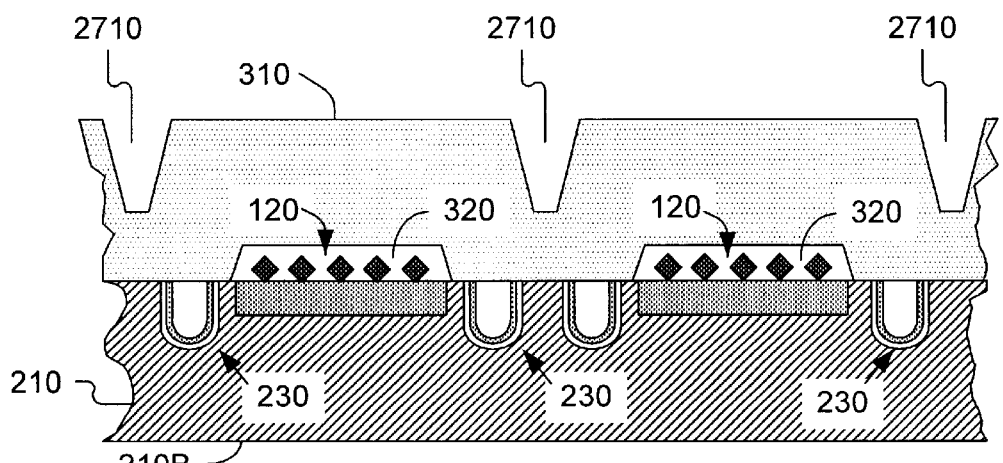
FIGS. 27–29 are vertical cross-sectional views of devices with non-electronically-functioning components at different stages of fabrication according to the present invention.
Figure 28:
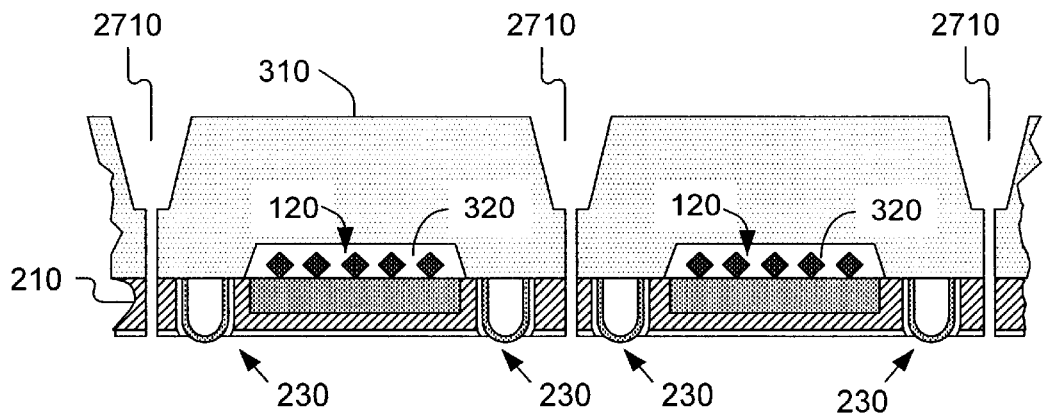

In FIG. 27, cavities 2710 have been formed in wafer 310 on the top side along the dicing lines. Cavities 2710 can be formed before or after the wafers 310, 210 are bonded together. Cavities 2710 can extend the whole length of the dicing lines, or can be scattered along the dicing lines in any pattern. FIG. 28 shows the structure after dicing. Cavities 2710 reduce the stress during dicing and also reduce the time that the structure is exposed to the stress. The dicing damage is therefore less. This is particularly advantageous if substrate 310 is a transparent substrate used for optical purposes, since damage to substrate 310 can cause optical distortion.

Cavities 2710 can be used in conjunction with any of the structures and processes described above in connection with FIGS. 2–26.

Figure 29:
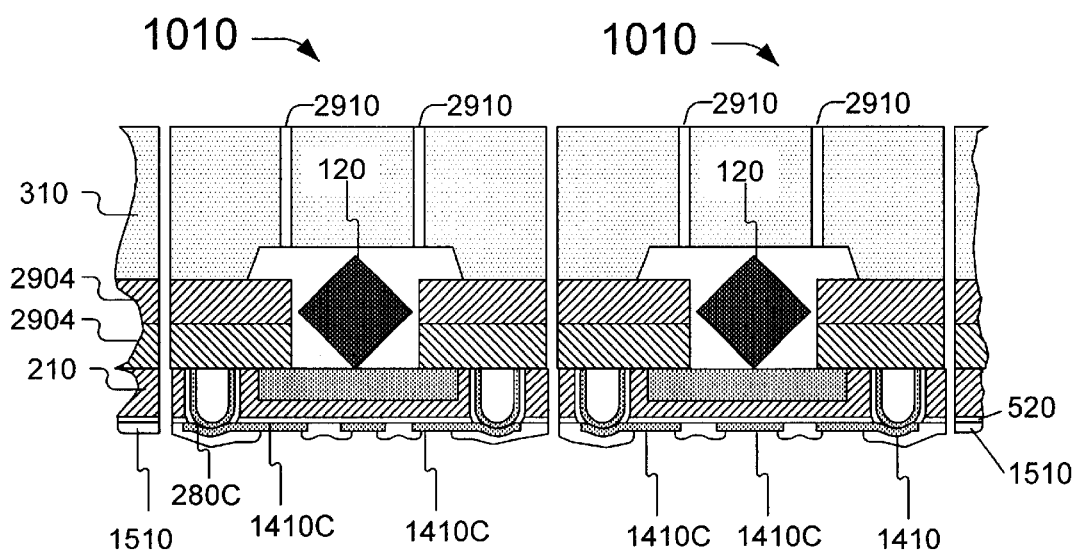

Structures 120 can be manufactured using multiple wafers. In the example of FIG. 29, structures 120 include portions of wafer 210 and of wafers 2904 bonded to the front side of wafer 210. Examples of such structures include micropumps. See for example U.S. Pat. No. 6,116,863 issued Sep. 12, 2000, entitled "Electromagnetically Driven Microactuated Device and Method of Making the Same". In FIG. 29, passages 2910 in wafer 310 represent the pumps' inlets and outlets. During fabrication, the wafers 2904 and the front side of wafer 210 are processed as needed to manufacturer the structures 120. Wafers 210, 2904 are bonded together. Wafer 310 is processed as needed (for example, to form cavities 320 of FIG. 3, or stand-off features 2110 of FIG. 24, or passages 2910). Then wafer 310 is bonded to the top wafer 2904. After that, fabrication proceeds as described above in connection with FIGS. 4–28. The backside of wafer 210 is processed to expose the contact structures 230. The wafer backside in FIG. 29 is as in FIG. 19, but other processes described above can also be used. FIG. 29 shows the structure after dicing.

The embodiments described above illustrate but do not limit the invention. The invention is not limited to any particular materials, processes, dimensions, layouts, or to any particular types of structures 120. Structures 120 may have mechanical components, that is, components that move during operation. Other embodiments and variations are within the scope of the invention, as defined by the appended claims.

What is claimed is:

1. A device comprising:
 a structure that has a plurality of substrates bonded together;
 wherein the plurality of substrates includes a first substrate which comprises a semiconductor substrate and which has a first side, a second side, and an opening passing through the semiconductor substrate from the first side to the second side, wherein the first substrate comprises circuitry which comprises a conductor present in the opening, the conductor extending to the second side of the first substrate and being exposed on the second side of the first substrate;
 wherein the structure further comprises a component which includes at least a portion of the first substrate and/or is attached to the first substrate, and at least a portion of the component is located at a surface of the first substrate on the first side of the first substrate;
 wherein the component is to co-operate with said circuitry so as to perform an optical function and/or a magnetic function and/or to move and/or deform;
 wherein the plurality of substrates comprise a second substrate bonded to the first side of the first substrate, wherein the second substrate does not contain any electronic circuitry coupled to the circuitry in the first substrate.

2. The device of claim 1 wherein the circuitry is for controlling the component and/or receiving a signal indicative of the state of the component.

3. The device of claim 1 wherein the structure comprises a stand-off feature between the first and second substrates on the surface of the first substrate on the first side of the first substrate, the stand-off feature surrounding the component.

4. The device of claim 1 wherein the structure comprises a stand-off feature between the first and second substrates, the stand-off feature maintaining a predefined minimum distance between the first and second substrates to prevent damage to the component.

5. The device of claim 4 wherein the material from which the stand-off feature is made fills the opening at least partially.

6. The device of claim 1 wherein the structure comprises a glass or resin ball between the first and second substrates, the glass or resin ball maintaining a predefined minimum distance between the first and second substrates to prevent damage to the component.

7. The device of claim 1 wherein the semiconductor substrate has a first semiconductor portion and a second semiconductor portion protruding out on the second side of the first substrate relative to the first semiconductor portion, the second portion being thicker than the first portion, and the opening is located in the first portion of the semiconductor substrate.

8. The device of claim 1 wherein:
 the o is positioned adjacent to a boundary of the structure; and
 the second portion comprises an extension extending towards the boundary of the structure.

9. The device of claim 8 wherein:
 the opening is one of a plurality of openings located in the first portion of the semiconductor substrate and passing through the semiconductor substrate from the first side to the second side, the openings being adjacent to a boundary of the structure, wherein the first substrate comprises a conductor in each of the openings;
 the extension extends between the openings.

10. The device of claim 8 wherein the extension comes at least as close to the boundary as the opening.

11. The device of claim 8 wherein the extension comes at least as close to the boundary as the exposed conductor on the second side.

12. The device of claim 8 wherein the extension reaches a corner of the structure.

13. The device of claim 7 further comprising:
one or more interconnect lines which overlay the second side and extend from the exposed conductor on the second side to the second portion; and
an insulator overlaying the conductor on the second side but exposing a contact on the second side on the second portion, the contact being electrically connected to the conductor by one or more of the interconnect lines.

14. The device of claim 1 in combination with a wiring substrate attached to the conductor's surface exposed on the second side.

15. The device of claim 1 wherein the second side is opposite from the first side.

16. The device of claim 1 wherein the opening contains a first insulator insulating the conductor from sidewalls of the opening.

17. The device of claim 16 further comprising a second insulator formed over the semiconductor substrate on the second side, the second insulator not completely covering the conductor on the second side.

18. The device of claim 1 further comprising an insulator formed over the semiconductor substrate on the second side, said insulator not completely covering the conductor on the second side.

19. The device of claim 1 wherein the opening is one or a plurality of openings each of which passes through the semiconductor substrate from the first side to the second side, and the device comprises a conductor present in each of the openings, the conductor extending to the second side of the first substrate and being exposed on the second side.

20. The device of claim 1 wherein the component is operable to move and/or deform in co-operation with the circuitry.

21. The device of claim 1 wherein the component comprises a relay.

22. The device of claim 1 wherein the component comprises a micropump.

23. The device of claim 1 wherein the component is an optical component.

24. The device of claim 23 wherein the optical component comprises a mirror or a lens.

25. The device of claim 1 wherein the component is to emit and/or sense visible and/or invisible light, and the second substrate is transparent to said visible and/or invisible light.

26. The device of claim 1 wherein the second substrate is a glass substrate.

27. The device of claim 1 wherein the second substrate does not contain any electronic circuitry coupled to the component.

28. The device of claim 1 wherein the component protrudes from the surface of the first substrate on the first side of the first substrate.

29. The device of claim 4 wherein the component protrudes from the surface of the first substrate on the first side of the first substrate.

30. The device of claim 1 wherein the conductor passes through the opening and reaches a circuit element at the first side of the first substrate.

31. The device of claim 1 wherein the second substrate comprises a cavity, and at least a portion of the component is positioned in the cavity at a surface of the first substrate on the first side of the first substrate.

32. A device comprising:
a structure comprising a first substrate which comprises a semiconductor substrate and which has a first side, a second side, an opening passing through the semiconductor substrate from the first side to the second side, and a conductor present in the opening, the conductor extending to the second side of the first substrate and being exposed on the second side;
wherein the semiconductor substrate has a first semiconductor portion and a second semiconductor portion protruding out on the second side of the first substrate relative to the first semiconductor portion, the second portion being thicker than the first portion, and the opening is located in the first portion of the semiconductor substrate;
wherein the device further comprises:
one or more interconnect lines which extend from the exposed conductor on the second side to the second portion; and
an insulator overlaying the conductor on the second side but exposing a contact on the second side on the second portion, the contact being electrically connected to the conductor by one or more of the interconnect lines.

33. The device of claim 32 wherein:
the opening is positioned adjacent to a boundary of the structure; and
the second portion comprises an extension extending towards the boundary of the structure.

34. The device of claim 32 wherein:
the opening is one of two openings located in the first portion of the semiconductor substrate and passing through the semiconductor substrate from the first side to the second side, the openings being adjacent to each other and to a boundary of the structure, wherein the first substrate comprises a conductor in each of the openings;
the second portion extends between the openings.

35. The device of claim 33 wherein the extension reaches the boundary.

36. The device of claim 33 wherein the second portion comes at least as close to the boundary as the exposed conductor on the second side.

37. The device of claim 32 wherein the second portion reaches a corner of the structure.

38. The device of claim 32 wherein:
the semiconductor substrate has a plurality of openings passing through the first portion of the semiconductor substrate from the first side to the second side, and a conductor present in each of the openings, each conductor extending to the second side of the first substrate and being exposed on the second side of the first substrate; and
the device further comprises:
one or more interconnect lines which extend from the exposed conductors on the second side to the second portion; and
an insulator overlaying the conductors on the second side but exposing a plurality of contacts on the second side on the second portion, the contacts being electrically connected to the conductors by one or more of the interconnect lines.

39. The device of claim 32 wherein the opening contains a first insulator insulating the conductor from sidewalls of the opening.

40. The device of claim 39 further comprising a second insulator formed over the semiconductor substrate on the second side, the second insulator not completely covering the conductor on the second side.

41. The device of claim 32 further comprising an insulator formed over the semiconductor substrate on the second side, said insulator not completely covering the conductor on the second side.

42. The device of claim 32 wherein the contact on the second portion is bonded to a wiring substrate.

43. The device of claim 32 further comprising a second substrate bonded to the first side of the first substrate.

44. The device of claim 38 wherein at least one exposed contact is larger than the exposed portion of at least one conductor.

45. The device of claim 38 wherein the exposed conductors are located in a periphery of the second side, but at least one exposed contact is not located in the periphery.

46. A device comprising:
   a structure that has a plurality of substrates bonded together and also has circuitry;
   wherein the plurality of substrates includes a first substrate which comprises a semiconductor substrate and which has a first side, a second side, and an opening passing through the semiconductor substrate from the first side to the second side, wherein the circuitry comprises a conductor present in the opening and extending to the second side of the first substrate, the conductor being available for making a physical contact thereto on the second side of the first substrate;
   wherein the structure further comprises a component which includes at least a portion of the first substrate and/or is attached to the first substrate, and at least a portion of the component protrudes out of the first substrate on the first side of the first substrate;
   wherein the component is to co-operate with said circuitry so as to perform an optical function and/or a magnetic function and/or to move and/or deform;
   wherein the plurality of substrates comprise a second substrate bonded to the first side of the first substrate, wherein the second substrate comprises a cavity, and at least said protruding portion of the component is positioned in the cavity.

47. The device of claim 46 wherein the second substrate comprises a semiconductor substrate, and a portion of said circuitry is located in the second substrate and is coupled to said component.

48. The device of claim 46 wherein the circuitry is for controlling the component and/or receiving a signal indicative of the state of the component.

49. The device of claim 46 in combination with a wiring substrate attached to the conductor's surface on the second side.

50. The device of claim 46 wherein the second side is opposite from the first side.

51. The device of claim 46 wherein the opening contains a first insulator insulating the conductor from sidewalls of the opening.

52. The device of claim 46 wherein the component is operable to move and/or deform in co-operation with the circuitry.

53. The device of claim 46 wherein the component comprises a relay.

54. The device of claim 46 wherein the component comprises a micropump.

55. The device of claim 46 wherein the component is an optical component.

56. The device of claim 55 wherein the optical component comprises a mirror or a lens.

57. The device of claim 46 wherein the component is to emit and/or sense visible and/or invisible light, and the second substrate is transparent to said visible and/or invisible light.

58. The device of claim 46 wherein the second substrate is a glass substrate.

* * * * *